United States Patent
Choi

(10) Patent No.: US 9,679,921 B2
(45) Date of Patent: *Jun. 13, 2017

(54) DISPLAY SUBSTRATE AND METHOD OF FABRICATING THE SAME

(71) Applicant: Samsung Display Co., Ltd., Yongin (KR)

(72) Inventor: Young-Joo Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/753,867

(22) Filed: Jun. 29, 2015

(65) Prior Publication Data

US 2016/0064414 A1    Mar. 3, 2016

(30) Foreign Application Priority Data

Aug. 27, 2014  (KR) .................. 10-2014-0112346

(51) Int. Cl.
*H01L 27/12* (2006.01)
*H01L 29/49* (2006.01)

(52) U.S. Cl.
CPC ........ *H01L 27/124* (2013.01); *H01L 27/1288* (2013.01); *H01L 29/4908* (2013.01)

(58) Field of Classification Search
CPC . H01L 27/124; H01L 27/1218; H01L 27/127; H01L 29/45; H01L 29/4908; H01L 29/495; H01L 27/1288; H01L 27/1262
See application file for complete search history.

(56) References Cited

U.S. PATENT DOCUMENTS

| 6,414,730 | B1 | 7/2002 | Aksmatsu |
| 7,872,722 | B2* | 1/2011 | Kimura ............... H01L 27/1218 349/114 |
| 2008/0136990 | A1 | 6/2008 | Kimura |
| 2011/0024758 | A1 | 2/2011 | Kimura |
| 2011/0050551 | A1 | 3/2011 | Ota et al. |
| 2011/0310341 | A1* | 12/2011 | Kim ..................... H01L 27/1288 349/140 |
| 2013/0119392 | A1* | 5/2013 | Park ...................... H01L 27/326 257/72 |
| 2015/0235585 | A1* | 8/2015 | Kim ........................ G09G 3/18 345/103 |

(Continued)

FOREIGN PATENT DOCUMENTS

KR   10-2000-0029304   5/2000
KR   10-2003-0058237   7/2003

(Continued)

OTHER PUBLICATIONS

Non-Final Office Action dated Apr. 28, 2016 in U.S. Appl. No. 14/731,272.

(Continued)

*Primary Examiner* — William Coleman
(74) *Attorney, Agent, or Firm* — H.C. Park & Associates, PLC

(57) ABSTRACT

Disclosed are a display substrate, of which productivity is improved by decreasing five mask (M) processes utilized for fabricating the display substrate used in a liquid crystal display device in a horizontal field (Plane to Line Switching (PLS)) mode to four mask processes, and a method of fabricating the same.

10 Claims, 3 Drawing Sheets

(56) References Cited

U.S. PATENT DOCUMENTS

2016/0062198 A1* 3/2016 Wang ................ G02F 1/134363
                                                    257/72
2016/0064412 A1* 3/2016 Choi ................. H01L 29/42384
                                                    257/72
2016/0064414 A1   3/2016 Choi
2016/0064420 A1* 3/2016 Choi .................. H01L 27/1214
                                                    257/72

FOREIGN PATENT DOCUMENTS

KR   10-2011-0040167    4/2011
KR   10-2012-0125823    11/2012

OTHER PUBLICATIONS

Final Office Action dated Aug. 4, 2016 in U.S. Appl. No. 14/731,272.
Non-Final Office Action dated Apr. 8, 2016 in U.S. Appl. No. 14/725,993.
Non-Final Office Action Issued on Dec. 1, 2016 for U.S. Appl. No. 14/731,272.
Notice of Allowance dated Mar. 6, 2017, in U.S. Appl. No. 14/725,993.

* cited by examiner

DISPLAY SUBSTRATE AND METHOD OF FABRICATING THE SAME

CROSS-REFERENCE TO RELATED APPLICATION

This application claims priority from and the benefit of Korean Patent Application No. 10-2014-0112346, filed on Aug. 27, 2014, which is hereby incorporated by reference for all purposes as if fully set forth herein.

BACKGROUND

Field

Exemplary embodiments relate to a display substrate, and a method of fabricating the same. More particularly, exemplary embodiments relate to reducing the number of masks from five (5) to four (4) when fabricating the display substrate used in a liquid crystal display device in a horizontal field (Plane to Line Switching (PLS)) mode.

Discussion of the Background

In general, a liquid crystal display device includes a display substrate comprising a switching element and a pixel electrode, an opposing substrate opposite to the display substrate, and a liquid crystal layer interposed between the display substrate and the opposing substrate. The liquid crystal display device displays an image by applying different levels of voltages to the liquid crystal layer and controlling the light transmittance.

The liquid crystal display device may be divided into a vertical field mode and a horizontal field mode according to the direction of the electric field.

Currently, liquid crystal display devices operated using a vertical field mode have problems with wide angle viewing, which led to active development of liquid crystal display devices operated using horizontal field mode. Particularly, research for reducing manufacturing costs of a liquid crystal display device operated in a Plane to Line Switching (PLS) mode, which is an example of the horizontal field mode, is being conducted.

The display substrate includes a plurality of thin film patterns formed by patterning a thin film formed on an insulating substrate through a photolithography process. Each of the thin film patterns may be formed by forming a photo-resistant pattern on the thin film, and etching the thin film by using the photo-resistant pattern as an etch mask. The photolithography process may be performed by dry etching or wet etching according to the properties of the thin film. When the thin film includes metal, it may generally be patterned by using a composition of etchants, and when the thin film is an insulating layer, including a silicon oxide and the like, it may generally be patterned by using etching gas.

In order to form one thin film pattern, a mask including a design of the thin film pattern is used. In order to minimize the use of a high-priced mask or to simplify a process, two or more thin films may be patterned by using one mask. However, even when one mask is used, when properties of the thin films are different from each other, the etching process must be performed using different methods. So it is not easy to substantially decrease the number of process steps.

Accordingly, the present disclosure shows a method of decreasing a five mask (M) processes to a four mask (M) processes, which will be described in detail herein.

The above information disclosed in this Background section is only for enhancement of understanding of the background of the inventive concept, and, therefore, it may contain information that does not form the prior art that is already known in this country to a person of ordinary skill in the art.

SUMMARY OF THE INVENTION

The present disclosure has been made in an effort to solve the above-described problems associated with the prior art, and provides a display substrate, of which production cost may be lowered by reducing a five mask (M) processes utilized in fabricating the display substrate used in a liquid crystal display device in a Plane to Line Switching (PLS) mode to a four mask processes.

The present disclosure has also been made in an effort to solve the above-described problems associated with the prior art, and provides a method of fabricating a display substrate, which may improve productivity by decreasing the number of masks from five (5) to four (4) for fabricating the display substrate used in a liquid crystal display device in a Plane to Line Switching (PLS) mode.

Additional aspects will be set forth in the detailed description which follows, and, in part, will be apparent from the disclosure, or may be learned by practice of the inventive concept.

An exemplary embodiment of the present disclosure provides a display substrate that includes a lower common electrode formed on a substrate, an insulating layer formed on the lower common electrode, a gate pattern including a gate electrode formed on the insulating layer and a common electrode contact part spaced apart from the gate electrode, a gate insulating layer formed on a substrate including the gate pattern, a semiconductor layer disposed on the gate insulating layer, source and drain electrodes formed on the semiconductor layer, a passivation layer formed on the source and drain electrodes, a pixel unit formed on the passivation layer, and a common electrode contact connection part spaced apart from the pixel unit and configured to make the common electrode contact part be in side contact with the lower common electrode.

The lower common electrode may be entirely deposited and not patterned.

The lower common electrode and the pixel unit may use Transparent Conductive Oxide (TCO)-based metal.

The insulating layer and the gate insulating layer may use a Si-based insulating layer.

The gate electrode and the source/drain electrodes use material selected from a group consisting of copper, aluminum, molybdenum, tungsten, titanium, and chrome, in single or alloy form.

Another exemplary embodiment of the present disclosure includes a method of fabricating a display substrate. It includes steps of entirely depositing a lower common electrode on a substrate, depositing an insulating layer on the lower common electrode, depositing and first patterning gate metal on the insulating layer to form a gate electrode and a common electrode contact part, forming a gate insulating layer on a substrate including a gate pattern, depositing and second patterning a semiconductor material on the gate insulating layer to form a semiconductor layer, depositing and third patterning source/drain metal on the semiconductor layer to form source and drain electrodes, depositing and fourth patterning a passivation layer on the source and drain electrodes to open a pixel area, and forming a first contact hole and a second contact hole at the common electrode contact part, depositing pixel metal at the first contact hole and the second contact hole, and forming an upper pixel unit and a common electrode contact connection part.

The common electrode contact part may be in contact with the side of lower common electrode with pixel metal when the passivation layer is patterned.

The gate pattern may be patterned by wet etching, while the area from gate electrode to the lower common electrode is patterned by dry etching.

According to the exemplary embodiments of the present disclosure, the display substrate and the method of fabricating the same use less number of photo masks than the conventional process, and may thereby improve the productivity.

Further, according to the exemplary embodiments of the present disclosure, the common electrode is entirely deposited, thereby decreasing defects caused by static electricity.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE INVENTION

Figure 1:
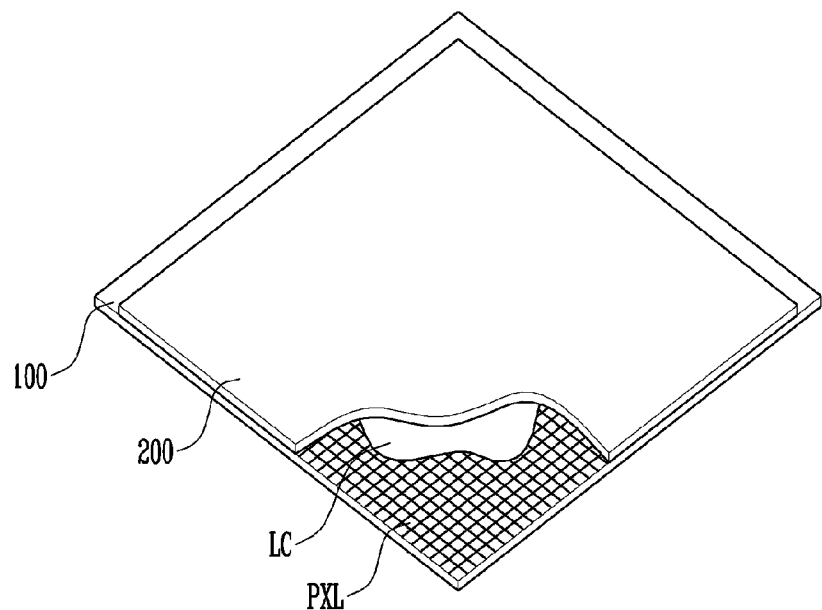
FIG. 1 is an exploded perspective view illustrating a display device including a display substrate according to a first exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is an exploded perspective view illustrating a display device including a display substrate according to a first exemplary embodiment of the present invention.

Referring to FIG. 1, the display device includes a display substrate 100 including a plurality of pixels PXL, an opposing substrate 200 opposite to the display substrate 100, and a liquid crystal layer LC disposed between the display substrate 100 and the opposing substrate 200.

Each pixel of the display substrate 100 includes at least one thin film transistor, a pixel electrode, and a common electrode for driving liquid crystal molecules. The opposing substrate 200 may include color filters for expressing colors of an image.

The liquid crystal layer LC includes a plurality of liquid crystal molecules having dielectric anisotropy. When an electric field is applied between the pixel electrode and the common electrode of the display substrate 100, the liquid crystal molecules of the liquid crystal layer LC rotates in a specific direction between the display substrate 100 and the opposing substrate 200, thus allowing the transmittance of light incident to the liquid crystal layer LC to be adjusted.

Figure 2:
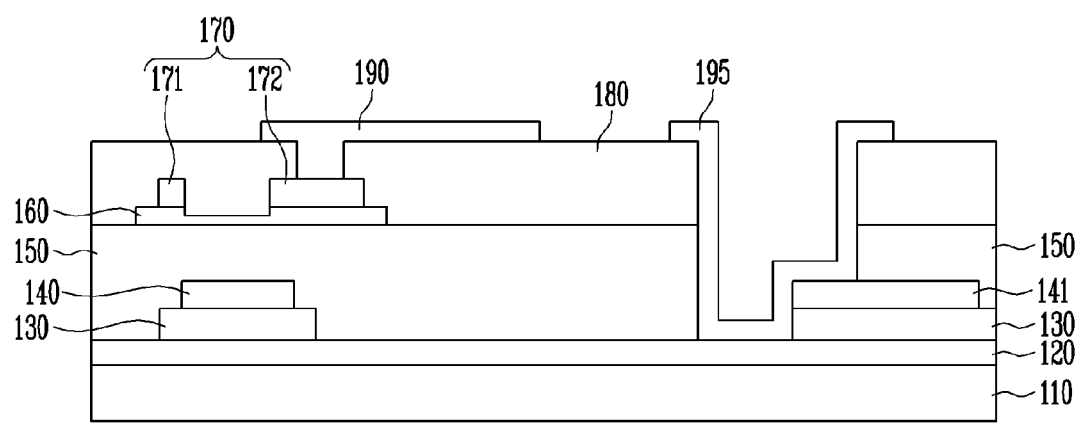
FIG. 2 is a cross-sectional view of the display substrate according to the first exemplary embodiment of the present invention.

FIG. 2 is a cross-sectional view of the display substrate according to the first exemplary embodiment of the present invention. FIGS. 3A to 3F are schematic diagrams illustrating a process of fabricating the display substrate according to the first exemplary embodiment of the present invention.

Referring to FIG. 2, the display substrate 100 includes an insulating substrate 110 including a plurality of pixel areas, a common electrode 120, a gate electrode 140, a source electrode 171 and a drain electrode made from the same layer as a data line 170, and a plurality of pixel electrodes 190. Here, each of the pixels has the same structure, so that, for convenience of the description, FIG. 2 illustrates one pixel PXL among the pixels, and one common electrode line CL, one gate line GL, and two data lines DL adjacent to the pixel PXL.

Figure 3A:
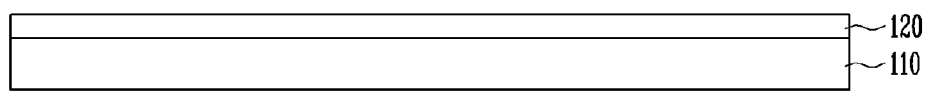
FIGS. 3A to 3F are schematic diagrams illustrating a method of fabricating the display substrate according to the first exemplary embodiment of the present invention.

Referring to FIGS. 2 and 3A, the substrate 110 may be formed of a transparent insulating material. A plurality of pixel areas may be disposed on the substrate 110 in a matrix form.

A lower common electrode 120 is disposed on the substrate 110. The lower common electrode 120 is deposited on the entire substrate 110, and is not patterned. The common electrode 120 is entirely deposited on the substrate 110, thereby exhibiting a similar effect as that of metal deposition on a rear surface. This effectively decreases the static electricity, because the electrical potential difference between the gate line and the data line is decreased.

A Transparent Conductive Oxide (TCO)-based material, for example, IZO and ITO, may be used in the lower common electrode 120, and the lower common electrode 120 may be formed in a predetermined thickness by a generally known method in this field, for example, sputtering or Chemical Vapor Deposition (CVD).

Figure 3B:
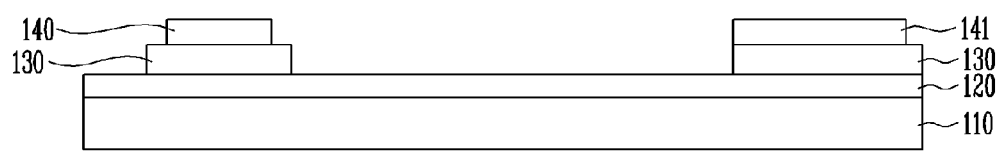

As illustrated in FIG. 3B, an insulating layer 130 is disposed on the lower common electrode 120. Here, a Si-based material, for example, SiNx, SiOx, or SiONx, may be used as insulating layer. The insulating layer may be formed in a predetermined thickness by a general method in this field, for example, sputtering or CVD.

The insulating layer 130 insulates the lower common electrode 120 from the gate electrode 140.

A gate layer is formed on the insulating layer 130 and patterned to include the gate line GL and the gate electrode 140. Further, a common electrode contact part (com-CNT) 141 is patterned on the same layer together with the gate electrode 140 while being spaced apart from the latter.

The gate line GL and the gate electrode 140 is formed of the same material as the common electrode contact part 141 disposed on the same layer.

The insulating layer 130 formed on the lower common electrode 120 is patterned when patterning the gate electrode 140. Also, the common electrode contact part 141 disposed on the same layer as that of the gate electrode 140 may be formed simultaneously.

In this case, the gate pattern and the common electrode contact part 141 disposed on the same layer may be formed by patterning the gate electrode 140 by using photoresist as a first mask (not illustrated). The gate pattern may be patterned by a generally known method in this field, for example, dry etching or wet etching. More preferably, the gate pattern may be patterned by wet etching, and the insulating layer 130 may be patterned by dry etching.

The insulating layer 130 between the gate electrode 140 and the common electrode 120 may exist only in an area in which the gate pattern is formed, and in this case, the insulating layers may have a structure protruding to the outside of the gate pattern.

Material, such as copper, aluminum, molybdenum, tungsten, or chrome, may be used for the gate line GL, the gate electrode 140, and the common electrode contact part 141, and Mo, Ti, or an Mo/Ti alloy may be used at an upper/lower side of the metal, and may be formed as a single layer, a multilayer, or an alloy layer, for example, a molybdenum-aluminum-molybdenum (Mo—Al—Mo) triple layer or a molybdenum-aluminum alloy layer.

Figure 3C:
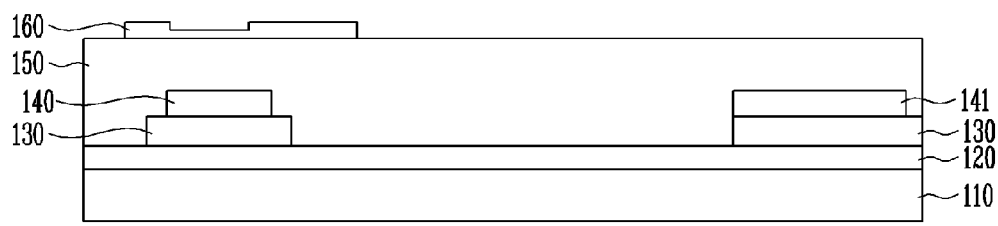

As illustrated in FIG. 3C, the gate insulating layer 150 is formed on the substrate on which the gate electrode 140 and the common electrode contact part 141 are formed, and the gate insulating layer 150 covers the gate electrode 140, the gate line GL, and the common electrode contact part 141. They are insulated from another conductive thin film, which is formed later, by the gate insulating layer 150.

Then, a semiconductor layer 160 is formed by depositing a semiconductor thin film on the gate insulating layer 150 and patterning the semiconductor thin film. In this case, the semiconductor layer 160 is formed by patterning the semiconductor thin film by using photoresist as a second mask (not illustrated). Similarly, the semiconductor thin film may be patterned by a generally-known method in this field, for example, dry etching or wet etching.

Si-based material, for example, SiNx, SiOx, or SiONx, may be used as the gate insulating layer 150, and the gate insulating layer 150 may be formed in a predetermined thickness by a generally-known method in this field, for example, sputtering or CVD.

A general semiconductor layer in this field may be used as the semiconductor layer 160, and for example, amorphous silicon (n+ a-Si) doped with n+ at a high concentration and the like may be used, so that the semiconductor layer 160 may be formed in a predetermined thickness, but the semiconductor layer 160 is not limited thereto.

Figure 3D:
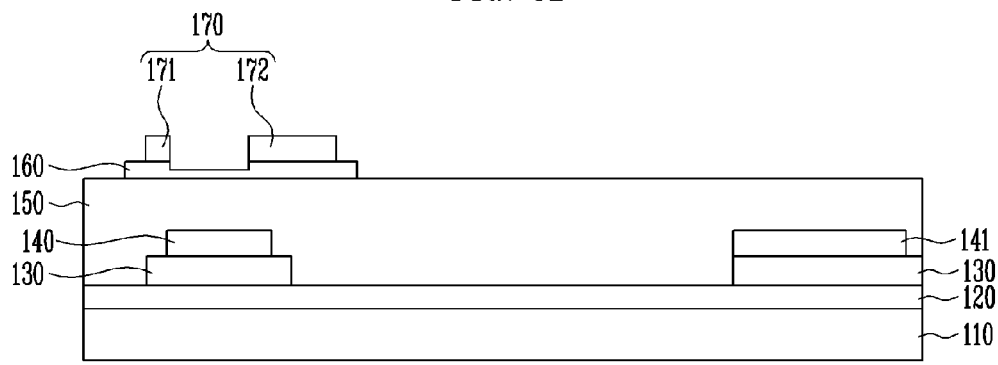

As illustrated in FIG. 3D, a source and drain electrode 170 is disposed on the semiconductor layer 160.

That is, source/drain metal is deposited and patterned on source and drain electrode regions on the semiconductor layer 160 to form the data line DL and the source and drain electrode 170.

Here, material such as copper, aluminum, molybdenum, tungsten, or chrome, may be used as the data line DL and the source/drain electrode, and Mo, Ti, or an Mo/Ti alloy may be used at an upper/lower side of the metal, and may be formed in a single layer, a multilayer, or an alloy layer, for example, a molybdenum-aluminum-molybdenum (Mo—Al—Mo) triple layer or a molybdenum-aluminum alloy layer.

The source electrode 171 is branched from the data line DL. In plane, the source electrode 171 overlaps a part of the semiconductor layer 160. The drain electrode 172 is spaced apart from the source electrode 171, and overlaps another part of the semiconductor layer 160.

In this case, the source electrode 171 and the drain electrode 172 are formed by patterning the source/drain metal by using photoresist as a third mask (not illustrated). A Half-Tone (HT) mask may be used for this patterning step.

Figure 3E:
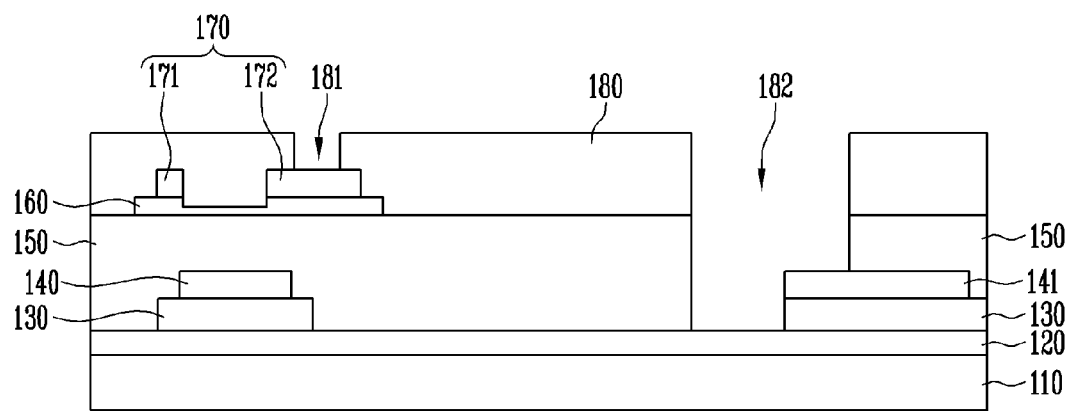

As illustrated in FIG. 3E, the display substrate 100 includes a passivation layer 180 on the source and drain electrode 170. The passivation layer 180 may be formed of an organic or inorganic insulating material. The passivation layer 180 is patterned to form a first contact hole 181, and a second contact hole 182 at the common electrode contact part 141.

In this case, the first contact hole 181 and the second contact hole 182 are formed by patterning the passivation layer 180 by using photoresist as a fourth mask (not illustrated).

Figure 3F:
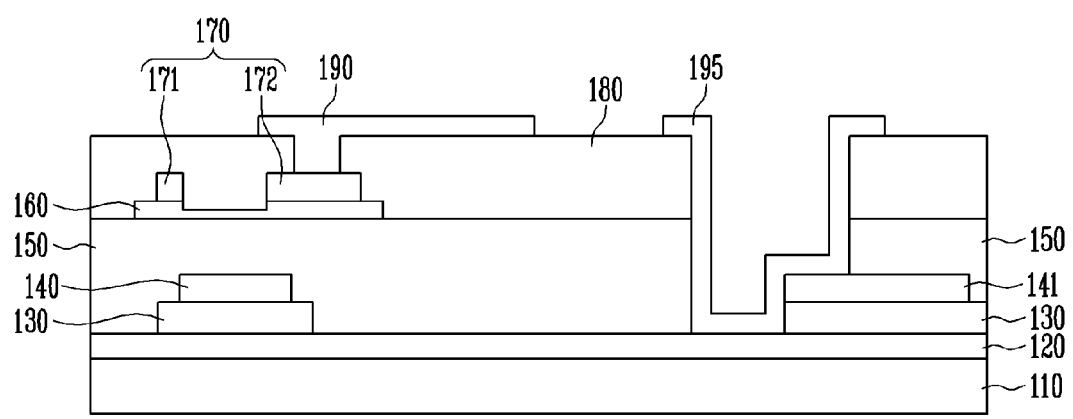

As illustrated in FIG. 3F, a pixel unit 190 is formed of a TCO-based material in the pixel area. The TCO-based material is deposited on the second contact hole, to form a common electrode-contact connection part 195, in which the common electrode contact part 141 is in side-contact with the common electrode-contact connection part 195. In other words, the common electrode-contact connection part 195 directly contacts a side surface of the common electrode contact part 141.

The method of fabricating the display substrate according to the exemplary embodiment of the present disclosure may improve production yield by decreasing the number of existing processes.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those skilled in the art that various changes in form and details may be made without departing from the spirit and scope of the present invention as set forth in the following claims.

What is claimed is:

1. A display substrate, comprising:
    a common electrode formed on a substrate;
    an insulating layer formed on the common electrode;
    a gate pattern formed on the insulating layer comprising a gate electrode and a common electrode contact part spaced apart from the gate electrode;
    a gate insulating layer formed on the gate pattern;
    a semiconductor layer disposed on the gate insulating layer;
    a source electrode and a drain electrode formed on the semiconductor layer;
    a passivation layer formed on the source electrode and the drain electrode;
    a pixel electrode formed on the passivation layer; and
    a common electrode contact connection part spaced apart from the pixel electrode
    wherein the common electrode-contact connection part directly contacts a side surface of the common electrode contact part.

2. The display substrate of claim 1, wherein the common electrode is deposited on an entire surface of the substrate.

3. The display substrate of claim 1, wherein the common electrode and the pixel electrode each comprise a transparent conductive oxide-based material (TCO-based material).

4. The display substrate of claim 1, wherein the insulating layer and the gate insulating layer comprise a silicon-based material.

5. The display substrate of claim 1, wherein the gate electrode, the source electrode, and the drain electrode each comprise at least one of copper, aluminum, molybdenum, tungsten, titanium, and chrome.

6. A method of fabricating a display substrate, comprising:
    depositing a common electrode on a surface of a substrate;
    depositing an insulating layer on the common electrode;
    depositing a first metal layer on the insulating layer;
    patterning the first metal layer on the insulating layer to form a gate electrode and a common electrode contact part;
    depositing a gate insulating layer on the patterned first metal layer;
    depositing a semiconductor material on the gate insulating layer;
    depositing a second metal layer on the semiconductor layer;
    patterning the second metal layer and the semiconductor layer to form a source electrode and a drain electrode and the semiconductor pattern;
    depositing a passivation layer on the patterned second metal layer;
    patterning a passivation layer to form a first contact hole over the drain electrode and a second contact hole over a portion of the common electrode contact part and a portion of the common electrode adjacent to the common electrode contact part;
    depositing a transparent conductive oxide-based material (TCO-based material) on the passivation layer; and
    patterning the TCO-based material to form a pixel electrode and a common electrode-contact connection part that directly contacts a side surface of the common electrode contact part.

7. The method of claim 6, wherein patterning the first metal layer on the insulating layer to form the gate electrode and the common electrode contact part, further comprises:
    wet etching the first metal layer, and
    dry etching the insulating layer.

8. The method of claim 6, wherein a half-tone (HT) mask is used to pattern the second metal layer and the semiconductor layer to form a source electrode and a drain electrode and the semiconductor pattern.

9. The method of claim 6, wherein the second contact hole is formed over a portion of the common electrode that is immediately adjacent to the common electrode contact part.

10. The method of claim 7, wherein the common electrode-contact connection part directly contacts the common electrode.

* * * * *